US006946779B2

(12) United States Patent
Birgel

(10) Patent No.: US 6,946,779 B2
(45) Date of Patent: Sep. 20, 2005

(54) ELECTROMECHANICAL TRANSDUCER

(75) Inventor: Dietmar Birgel, Schopfheim (DE)

(73) Assignee: Endress & Hauser GmbH + Co. KG, Maulburg (DE)

( * ) Notice: Subject to any disclaimer, the term of this patent is extended or adjusted under 35 U.S.C. 154(b) by 147 days.

(21) Appl. No.: 10/296,248

(22) PCT Filed: May 16, 2001

(86) PCT No.: PCT/EP01/05542

§ 371 (c)(1),
(2), (4) Date: May 9, 2003

(87) PCT Pub. No.: WO01/95667

PCT Pub. Date: Dec. 13, 2001

(65) Prior Publication Data

US 2003/0168945 A1 Sep. 11, 2003

(30) Foreign Application Priority Data

Jun. 7, 2000 (DE) ........................................ 100 28 319

(51) Int. Cl.[7] ...................... H01L 41/083; H01L 41/047
(52) U.S. Cl. ....................................... 310/366; 310/328
(58) Field of Search ................................. 310/328, 366

(56) References Cited

U.S. PATENT DOCUMENTS

| | | | | |
|---|---|---|---|---|
| 4,488,080 A | | 12/1984 | Baumann | 310/328 |
| 4,701,659 A | | 10/1987 | Fujii et al. | 310/334 |
| 5,092,243 A | | 3/1992 | Hawkins et al. | 102/210 |
| 5,598,051 A | | 1/1997 | Frey | 310/334 |
| 5,773,913 A | | 6/1998 | Casselden | 310/338 |
| 5,945,770 A | * | 8/1999 | Hanafy | 310/322 |
| 6,345,887 B1 | * | 2/2002 | Sato | 347/72 |

FOREIGN PATENT DOCUMENTS

| | | | |
|---|---|---|---|
| DE | 4118793 A1 | 12/1992 | G01F/23/28 |
| DE | 19653085 A1 | 7/1998 | H04R/17/00 |
| EP | 0875741 A1 | 11/1998 | G01F/23/296 |

* cited by examiner

*Primary Examiner*—Thomas M. Dougherty
(74) *Attorney, Agent, or Firm*—Bacon & Thomas

(57) ABSTRACT

The invention relates to an electromechanical transducer that is easy and inexpensive to produce. The inventive transducer comprises stacked piezoelectric elements between which contact electrodes (G, S, E) are interposed via which the piezoelectric elements are electrically connected. The contact electrodes (G, S, E) are configured as planar terminal lugs that are connected to the outside from a flexible printed board.

15 Claims, 4 Drawing Sheets

FIG. 4
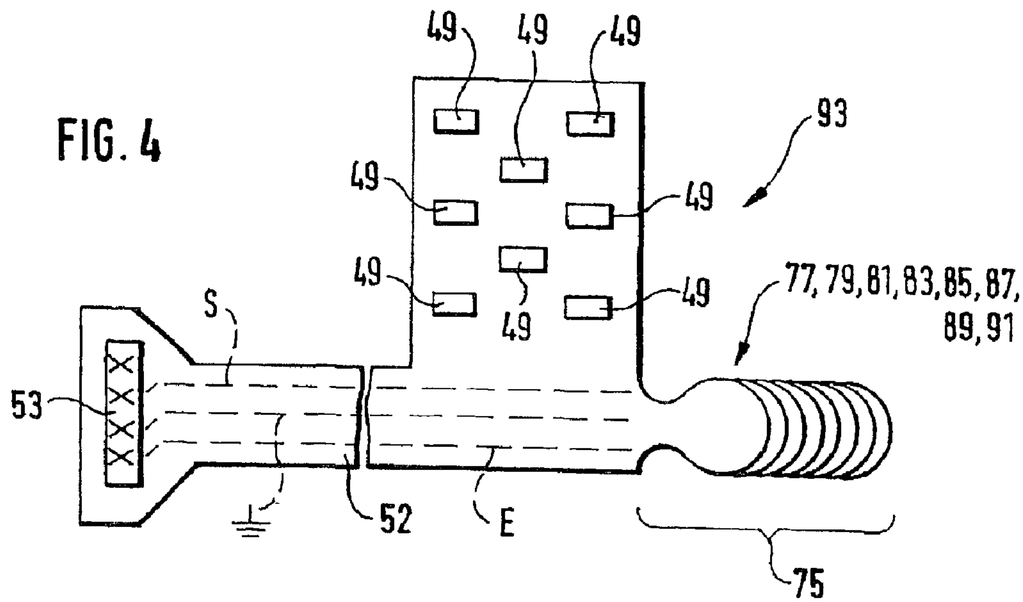
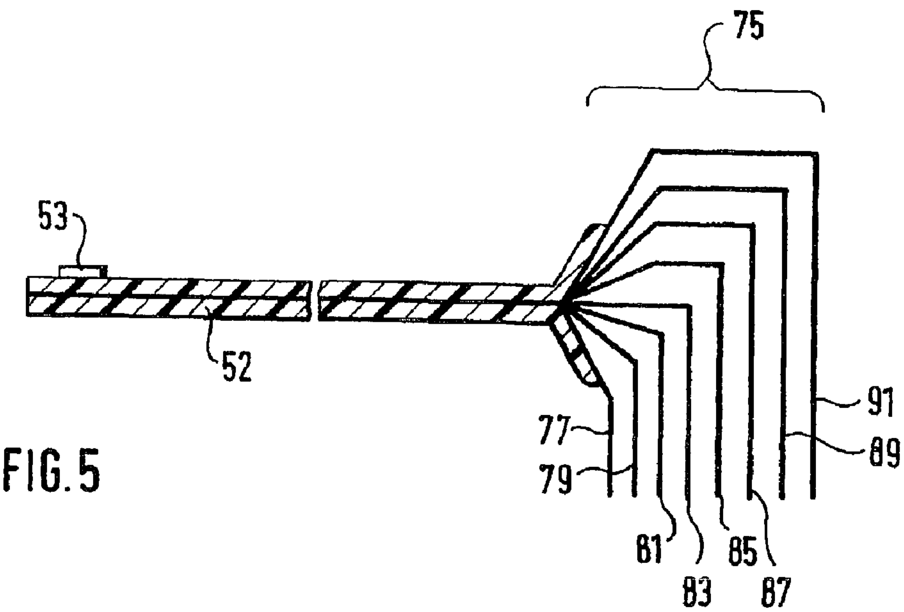
FIG. 5

ELECTROMECHANICAL TRANSDUCER

FIELD OF THE INVENTION

The invention relates to an electromechanical transducer, with piezoelectric elements disposed in a stack, between which contact electrodes are disposed by way of which the piezoelectric elements are electrically connected.

BACKGROUND OF THE INVENTION

Such electromechanical transducers are used in measurement and regulating technology, for instance. As an example, devices for ascertaining and/or monitoring a predetermined fill level in a container that have a mechanical oscillation structure, mounted at the level of the predetermined fill level, that is excited into oscillation by an electromechanical transducer are available on the market. One example of such a device is described in German Patent Disclosure DE-A 41 18 793. The oscillations of the mechanical oscillation structure are picked up and converted into electrical signals, which are accessible for further processing and/or evaluation. From the electrical signals, a frequency and/or an amplitude of the oscillation can for instance be determined. The frequency and/or amplitude offer information about whether the mechanical oscillation structure is covered by a product filling the container, or not.

Such fill level limit switches are used in many branches of industry, in particular in chemistry and in the food industry. They serve the purpose of limit state detection and are used for instance to secure against overfilling or to prevent pumps from running empty.

Electronic transducers with piezoelectric elements disposed in a stack offer the advantage that a plurality of piezoelectric elements can be connected electrically parallel and mechanically in series. As a result, a very robust, powerful transducer can be achieved.

In conventional electromechanical transducers, the piezoelectric elements are typically stacked mechanically, and planar electrodes are inserted between each two adjacent piezoelectric elements and secured for instance by means of an adhesive. These electrodes have contact lugs, extended out of the stack, by way of which the piezoelectric elements are to be connected.

Producing such a stack is very labor-intensive. This is very expensive, especially given the high numbers of items typically required.

SUMMARY OF THE INVENTION

It is one object of the invention to disclose an electromechanical transducer which is simple and inexpensive to produce.

To that end, the invention comprises an electromechanical transducer, which includes:

piezoelectric elements disposed in a stack;

between which, contact electrodes are disposed, by way of which the piezoelectric elements are electrically connected, wherein the contact electrodes are planar terminal lugs that are extended to the outside from a flexible printed circuit board.

In a first embodiment, the flexible printed circuit board has one portion embodied in steplike fashion; at each step, one planar terminal lug is extended to the outside, and the steps have a height that is equal to the thickness of the piezoelectric elements adjoining the respective step.

In a second embodiment, the stack comprises at least two partial stacks disposed one on the other, and the piezoelectric elements of each partial stack are connected by means of terminal lugs of the flexible printed circuit board that are disposed around a bottom face associated with the partial stack and are extended to the outside from the printed circuit board.

In a third embodiment, the flexible printed circuit board has one portion in which a plurality of conductor tracks extend one above the other, and in which each conductor track ends in a terminal lug extending perpendicular to the conductor track, and the individual terminal lugs are disposed parallel to one another and serve to connect piezoelectric elements adjoining them.

In one feature of one of the above embodiments, electronic components, in particular SMDs, are disposed on the flexible printed circuit board.

The invention also comprises a method for producing an electromechanical transducer of aforementioned electromechanical transducers, in which the flexible printed circuit board is equipped with components, the terminal lugs are disposed parallel to one another and one above the other by deformation of the flexible printed circuit board, as a result of which the piezoelectric elements are stacked on one another, and the stack is compacted.

In one embodiment of the method, the components are piezoelectric elements and SMDs, and the assembly is done automatically.

The invention moreover comprises a device for ascertaining and/or monitoring a predetermined fill level in a container, which device includes:

a mechanical oscillation structure to be mounted at the height of the predetermined fill level; and an electromechanical transducer according to the invention, which in operation serves to set the mechanical oscillation structure into oscillation and pick up its oscillations that are dependent on an instantaneous fill level and make them accessible for further processing and/or evaluation.

One advantage of the invention is that the terminal lugs are a component of the flexible printed circuit board. In other words, they are not individual, loose components that entail additional expenses but instead are merely specially shaped portions of the printed circuit board that is present anyway.

The terminal lugs of the flexible printed circuit board are especially well suited to production by machine. For instance, all the terminal lugs can be provided simultaneously with adhesive by machine and then equipped by machine with the piezoelectric elements. In the same assembly operation, further electronic components to be provided on the flexible printed circuit board are mounted in a single operation. Thus the manufacture of the electromechanical transducers of the invention can be done very quickly, quasi-fully automatically, and hence quite economically.

The invention and further advantages will now be described in further detail in conjunction with the drawing figures, which show three exemplary embodiments; identical elements are identified by the same reference numerals in the drawings.

BRIEF DESCRIPTION OF THE DRAWINGS

FIG. 4 shows an elevation view of a flexible printed circuit board with one portion in which a plurality of conductor tracks extend one above the other, and in which each conductor track ends in a terminal lug extending perpendicular to the conductor track;

FIG. 5 shows a section through the printed circuit board shown in FIG. 4;

DESCRIPTION OF THE PREFERRED EMBODIMENTS

Figure 1:
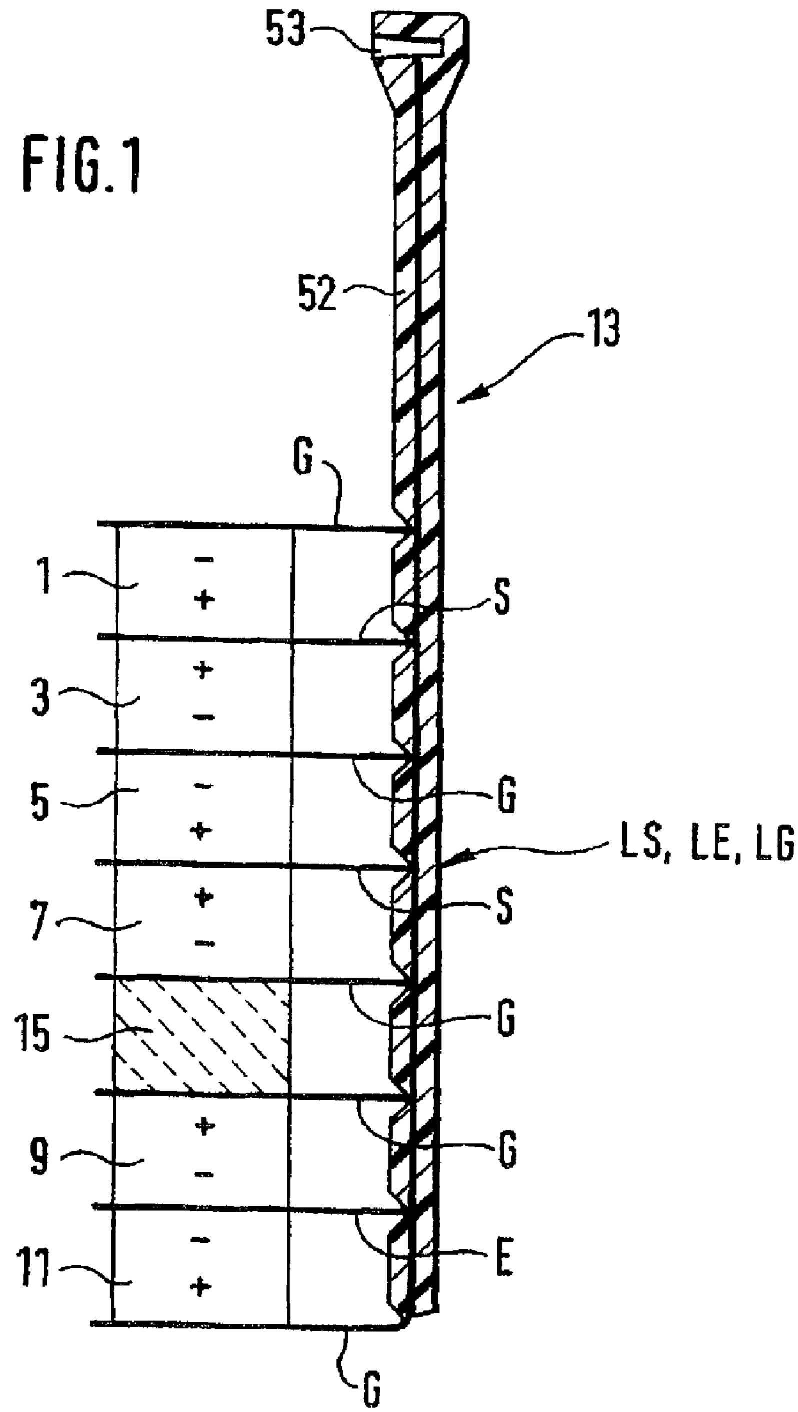
FIG. 1 shows an electromechanical transducer of the invention.

FIG. 1 shows an electromechanical transducer embodied according to the invention. It includes piezoelectric elements 1, 3, 5, 7, 9, 11 disposed in a stack. Between the piezoelectric elements 1, 3, 5, 7, 9, 11, there is one contact electrode S, E or G each above the topmost piezoelectric element 1 and below the bottommost piezoelectric element 11. The piezoelectric elements 1, 3, 5, 7, 9, 11 are connected electrically via the contact electrodes S, E, G to lines extending in a flexible printed circuit board 13; in the selected exemplary embodiment, these lines are a transmission signal line LS, a reception signal line LE, and a ground line LG. In the selected exemplary embodiment, the contact electrodes S are connected to the transmission signal line LS, the contact electrodes E are connected to the reception signal line LE, and the contact electrodes G are connected to the ground line LG.

The order of the piezoelectric elements and their electrical mode of connection to connection lines is arbitrary and should be selected in accordance with the later use of the transducer.

The arrangement selected in the exemplary embodiment for the piezoelectric elements 1, 3, 5, 7, 9, 11 and their electrical wiring is suitable for instance for use in a device, described at the outset, for ascertaining and/or monitoring a predetermined fill level.

The top four piezoelectric elements 1, 3, 5, 7 are connected electrically parallel and mechanically in series. To that end, the contact electrode G above the topmost piezoelectric element 1 is connected to the ground line LG; the contact electrode S between the topmost piezoelectric element 1 and the piezoelectric element 3 adjacent to it is connected to the transmission signal line LS; the next contact electrode G, between the piezoelectric element 3 and the piezoelectric element 5, is connected to the ground line LG; the contact electrode S, between the piezoelectric element 5 and the piezoelectric element 7, is connected to the transmission signal line LS; and the contact electrode G below the piezoelectric element 7 is connected to the ground line LG. The piezoelectric elements 1, 3, 5 and 7 all have a polarization parallel to a longitudinal axis of the stack. However, adjacent piezoelectric elements 1–3, 3–5, 5–7 are polarized oppositely. This is represented in FIG. 1 by their being marked with + and –.

An alternating voltage delivered via the transmission signal line LS leads to a synchronous, identically oriented thickness oscillation of the piezoelectric elements 1, 3, 5, 7. The partial stack formed by the piezoelectric elements 1, 3, 5, 7 acts for instance as a transmitter to excite oscillations that are dependent on the alternating voltage supplied.

Below the piezoelectric element 7 is a separator disk 15 comprising an insulator, such as a ceramic. The separator disk 15 brings about an electrical and mechanical decoupling of the upper piezoelectric elements 1, 3, 5, 7 from the piezoelectric elements 9, 11 disposed below the separator disk 15.

In the exemplary embodiment shown, the partial stack formed by the piezoelectric elements 9, 11 is embodied as a receiver. The piezoelectric elements 9, 11 are connected electrically parallel and mechanically in series. To that end, the contact electrode G above the piezoelectric element 9 and the contact electrode G below the piezoelectric element 11 are connected to the ground line LG. The contact electrode E disposed between the piezoelectric elements 9 and 11 is connected to the reception signal line LE.

If a mechanical oscillation structure is excited to oscillation by the transmitter, then the stack and the oscillation structure execute oscillations, which via the receiver are accessible, in the form of a voltage that can be picked up via the reception signal line LE and varies as a function of the resultant oscillation, to further processing and/or evaluation.

Flexible printed circuit boards are sold for instance by the company doing business as Schoeller Elektronik, under the tradename Polyflex. They comprise a thin copper sheet, for instance, which is treated in an etching process by Schoeller Elektronik in accordance with a desired conductor track configuration, and onto which afterward a thick polyimide cover film is laminated to both sides.

According to the invention, a flexible printed circuit board 13 is used in which the contact electrodes S, E, G are planar terminal lugs extended to the outside from the flexible printed circuit board 13. The terminal lugs are an integral component of the flexible printed circuit board 13. For instance, they are formed of suitably shaped segments of the copper sheet that are not provided with a cover film.

Figure 2:
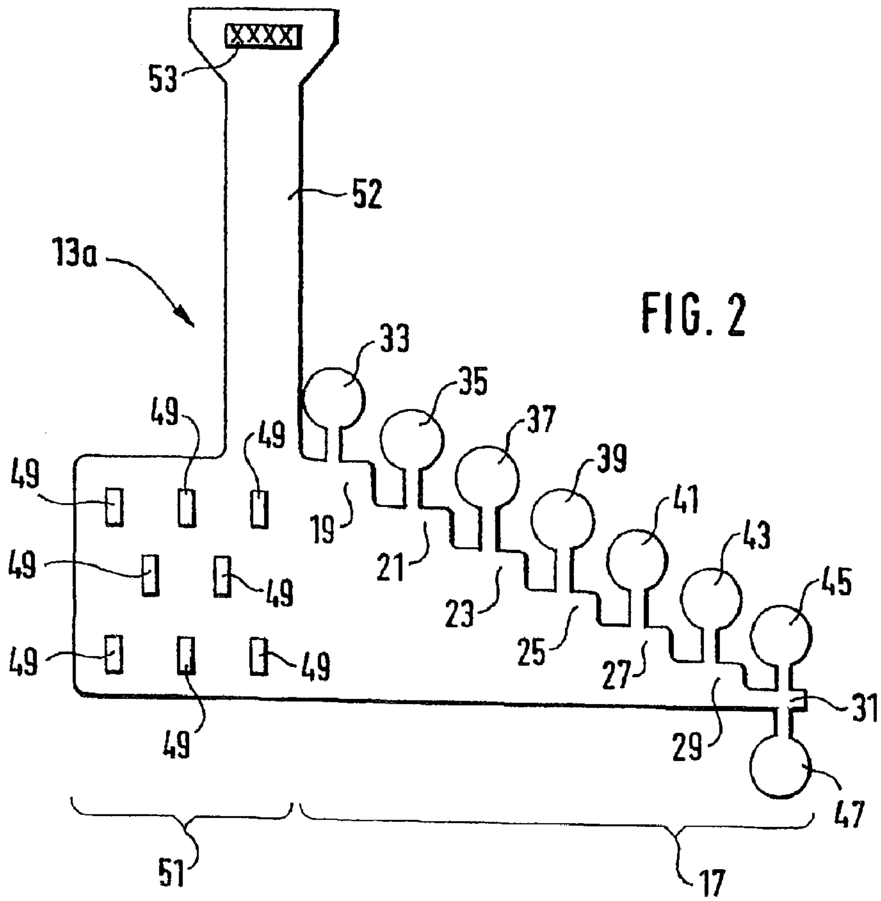
FIG. 2 shows an elevation view of a flexible printed circuit board with terminal lugs disposed in steplike fashion.

FIG. 2 shows an elevation view of a first exemplary embodiment of a flexible printed circuit board 13a embodied according to the invention. It has a steplike portion 17. In the exemplary embodiment shown, this portion includes seven steps 19, 21, 23, 25, 27, 29, 31. At each step 19, 21, 23, 25, 27, 29, 31, one planar terminal lug 33, 35, 37, 39, 41, 43, 45 is extended to the outside. The step at the edge that concludes the portion 17 is very low. At this step, not only is the terminal lug 45 is extended to the outside at a top of the step 31, but in addition, a further terminal lug 47 is extended to the outside from an underside of the step 31. The terminal lugs 33, 35, 37, 39, 41, 43, 45, 47 each have a narrow neck and a circular-segment-shaped electrode surface formed onto this end remote from the steps.

The steps 33, 35, 37, 39, 41, 43, 45 have a height that is equal to the thickness of the piezoelectric elements 1, 3, 5, 7, 9, 11 adjacent to the respective steps 33, 35, 37, 39, 41, 43, 45.

In the production of an electromechanical transducer of the invention, the flexible printed circuit board 13*a* is first equipped with components. "Components" here means the piezoelectric elements 1, 3, 5, 7, 9, 11, the separator disk 15, and optionally still other electronic components required on the printed circuit board 13*a*. Preferably, the electronic components in FIG. 2 are surface-mountable components or so-called SMDs 49, shown only schematically in FIG. 2, so that the assembly of the printed circuit board 13*a* can be done fully automatically. The SMDs 49 are disposed on a portion 51 adjacent to the steplike portion 17.

In the mounting of the piezoelectric elements 1, 3, 5, 7, 9, 11, an adhesive, for instance a conductive adhesive or an SMD adhesive, is applied to the terminal lugs 33, 35, 37, 39, 41, 43, 45, 47, and the piezoelectric element 1 is applied to the terminal lug 33, the piezoelectric element 3 is applied to the terminal lug 35, the piezoelectric element 5 is applied to the terminal lug 37, the piezoelectric element 7 is applied to the terminal lug 39, the separator disk 15 is applied to the terminal lug 41, the piezoelectric element 9 is applied to the terminal lug 43, and the piezoelectric element 11 is applied to the terminal lug 45.

Next, by deformation of the flexible printed circuit board 13*a*, the terminal lugs 33, 35, 37, 39, 41, 43, 45, 47 are disposed parallel to one another and one above the other. In the exemplary embodiment shown in FIG. 2, this is done by setting all the terminal lugs 33, 35, 37, 39, 41, 43, 45, 47 upright until they extend perpendicular to the portion 17 of the printed circuit board 13*a*, and then the portion 17 is rolled up, beginning at the side of the lowest step 31. In this way, the piezoelectric elements 1, 3, 5, 7, 9, 11 are stacked on one another with the interposition of the separator disk 15. The thus pre-formed stack is then compacted, in order to guarantee a secure electrical connection between the terminal lugs 33, 35, 37, 39, 41, 43, 45, 47 and the piezoelectric elements 1, 3, 5, 7, 9, 11.

As in the case of the electromechanical transducer 13 shown in FIG. 1, the terminal lugs 33, 37, 41, 43 and 47 form contact electrodes G, which are connected to a ground line LG, not shown in FIG. 2, that extends in the printed circuit board 13*a*. The terminal lugs 35, 39 form contact electrodes S, which are connected to a transmission signal line LS, not shown in FIG. 2, extending in the printed circuit board 13*a*. The terminal lug 45 forms a contact electrode E, which is connected to a reception signal line LE, not shown in FIG. 2, that extends in the printed circuit board 13*a*.

The printed circuit board 13*a* has a narrow extension 52, extending perpendicular to the portions 17 and 51, and a plug 53 is provided on the end of this extension. All the lines in the printed circuit board 13*a* that are to be connected to a terminal outside the printed circuit board 13*a* are extended within the extension 52. In the exemplary embodiment selected, these include the transmission signal line LS, the reception signal line LE, and the ground line LG.

Figure 3:
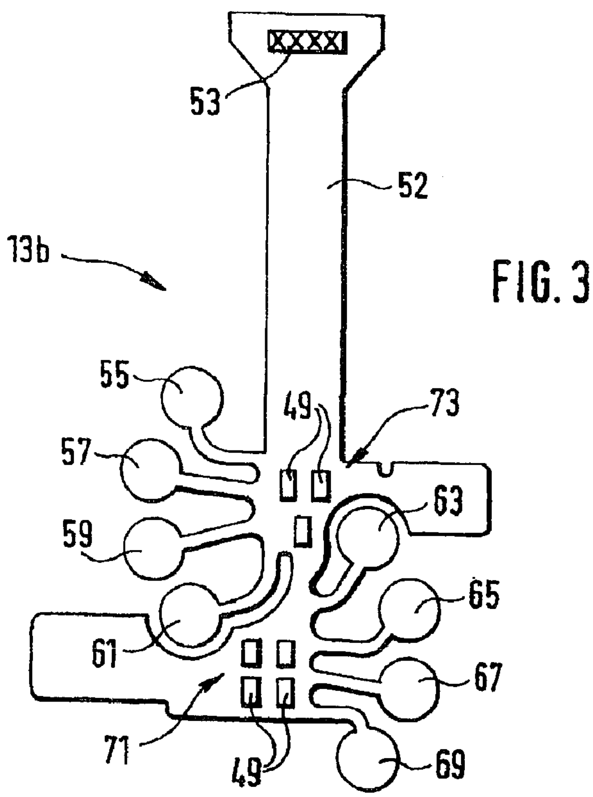
FIG. 3 shows an elevation view of a flexible printed circuit board with terminal lugs disposed in a ring around a bottom face.

FIG. 3 shows an elevation view of a further exemplary embodiment of a flexible printed circuit board 13*b*. The printed circuit board 13*b* differs from the printed circuit board 13*a* shown in FIG. 2 only in the disposition of the terminal lugs and the position of the SMDs 49 on the printed circuit board 13*a* and 13*b*, respectively.

In the exemplary embodiment shown in FIG. 3, terminal lugs 55, 57, 59, 61, 63, 65, 67, 69 are provided, which are each disposed in a ring around a bottom face 71, 73.

In this exemplary embodiment as well, it is provided that the stack is constructed as shown in FIG. 1 and comprises at least two partial stacks one on top of the other. Accordingly, the terminal lugs 55, 57, 59, 61 are disposed around the bottom face 71, and the terminal lugs 63, 65, 67, 69 are disposed around the bottom face 73.

The piezoelectric elements 1, 3, 5, 7, 9, 11 of each partial stack 1-3-5-7 and 9-11, respectively, are connected by means of terminal lugs 55, 57, 59, 61, 63, 65, 67, 69 of the flexible printed circuit board 13*b* that are disposed around the bottom face 71, 73 associated with the partial stack and are extended to the outside from the printed circuit board 13*b*.

In the mounting of the piezoelectric elements 1, 3, 5, 7, 9, 11, an adhesive, for instance a conductive adhesive or an SMD adhesive, is applied to the terminal lugs 55, 57, 59, 61, 63, 65, 67, 69, and the piezoelectric element 1 is applied to the terminal lug 55, the piezoelectric element 3 is applied to the terminal lug 57, the piezoelectric element 5 is applied to the terminal lug 59, the piezoelectric element 7 is applied to the terminal lug 61, the separator disk 15 is applied to the terminal lug 63, the piezoelectric element 9 is applied to the terminal lug 65, and the piezoelectric element 11 is applied to the terminal lug 67.

Next, the terminal lugs 55, 57, 59, 61, 63, 65, 67, 69 are disposed parallel to one another and one above the other by deformation of the flexible printed circuit board 13*b*. In the exemplary embodiment shown in FIG. 3, this is done in that the terminal lug 69 is bent upward, until it extends perpendicular to the printed circuit board 13*b*. Next, the terminal lug 67 is folded over, such that the piezoelectric element 11 mounted on it rests flatly on the terminal lug 69. The same procedure is done for the subsequent terminal lugs 65, 63, 61, 59, 57, 55. Finally, the piezoelectric element 9 disposed on the terminal lug 65 rests on a surface, remote from the piezoelectric element 11, of the terminal lug 67; the separator disk 15 disposed on the terminal lug 63 rests on a surface, remote from the piezoelectric element 9, of the terminal lug 65; the piezoelectric element 7 disposed on the terminal lug 61 rests on a surface, remote from the separator disk 15, of the terminal lug 63; the piezoelectric element 5 disposed on the terminal lug 59 rests on a surface, remote from the piezoelectric element 7, of the terminal lug 61; the piezoelectric element 3 disposed on the terminal lug 57 rests on a surface, remote from the piezoelectric element 5, of the terminal lug 59; and the piezoelectric element 1 disposed on the terminal lug 55 rests on a surface, remote from the piezoelectric element 3, of the terminal lug 57.

Here as well, accordingly, the flexible printed circuit board 13*b* is equipped with components; the terminal lugs 55, 57, 59, 61, 63, 65, 67, 69 are disposed parallel to one another and one above the other by deformation of the flexible printed circuit board 13*b*, as a result of which the piezoelectric elements 1, 3, 5, 7, 9, 11 are stacked on one another, and then the stack is compacted.

In this state, the bottom faces 71, 73 rest virtually in the form of tangential faces on the outside of the two partial stacks. SMDs 49 are disposed on both of the bottom faces 71, 73. It is understood that these or still other electronic components could also be provided at other locations on the printed circuit board 13*b*.

As in the case of the electromechanical transducer 13 shown in FIG. 1, the terminal lugs 55, 59, 63, 65, 69 here correspondingly form contact electrodes G that are connected to a ground line LG, not shown in FIG. 3, that extends in the printed circuit board 13*b*. The terminal lugs 57, 61 form contact electrodes S that are connected to a transmission signal line LS, not shown in FIG. 3, extending in the printed circuit board 13*b*. The terminal lug 67 forms a contact electrode E, which is connected to a reception signal line LE, not shown in FIG. 3, extending in the printed circuit board 13*b*.

In FIGS. 4 and 5, a further exemplary embodiment of a flexible printed circuit board 13*c* is shown. Below, only the differences from the previous exemplary embodiments will be described in detail.

The flexible printed circuit board 13*c* has one portion 75, in which a plurality of conductor tracks extend one above the other. Each of the conductor tracks ends in a terminal lug 77, 79, 81, 83, 85, 87, 89, 91 extending perpendicular to the conductor track. The individual terminal lugs 77, 79, 81, 83, 85, 87, 89, 91 are disposed parallel to one another and serve to connect piezoelectric elements 1, 3, 5, 7, 9 adjacent to them.

In production, the terminal lugs 77, 79, 81, 83, 85, 87, 89, 91 are provided with an adhesive for this purpose, and the interstices between the terminal lugs 77, 79, 81, 83, 85, 87, 89, 91 are equipped with the piezoelectric elements 1, 3, 5, 7, 9, 11 and the separator disk 15. In the process, the piezoelectric element 1 is placed between the terminal lugs 77 and 79; the piezoelectric element 3 is placed between the terminal lugs 79 and 81; the piezoelectric element 5 is placed between the terminal lugs 81 and 83; the piezoelectric element 7 is placed between the terminal lugs 83 and 85; the separator disk 15 is placed between the terminal lugs 85 and 87; the piezoelectric element 9 is placed between the terminal lugs 87 and 89; and the piezoelectric element 11 is placed between the terminal lugs 89 and 91.

In this exemplary embodiment, special deformation of the flexible printed circuit board 13*c* is not necessary, since the terminal lugs 77, 79, 81, 83, 85, 87, 89, 91 are already essentially in their final position; that is, in the form shown, they are already set upright, so that they extend perpendicular to the plane of the printed circuit board. After the assembly, here as well it is necessary for the stack to be compacted, in order to establish a permanent electrical and mechanical connection with the terminal lugs 77, 79, 81, 83, 85, 87, 89, 91.

The electrical connection of the terminal lugs 77, 79, 81, 83, 85, 87, 89, 91 to the transmission signal line LS, reception signal line LE and ground line LG is done analogously to the two exemplary embodiments above and will therefore not be described again here.

Precisely as in the preceding exemplary embodiments, the flexible printed circuit board 13*c* has an elongated extension 52, on the end of which a plug 53 is provided by way of which conductor tracks extending in the printed circuit board 13*c* can be contacted from outside. At a right angle to the extension 52, a further portion 93 of the printed circuit board 13*c* is provided, on which electronic components can be disposed. These components are preferably, as schematically indicated in FIG. 5, SMDs 49, which together with the piezoelectric elements 1, 3, 5, 7, 9, 11 and the separator disk 15 can be applied in an automatic assembly operation.

Figure 6:
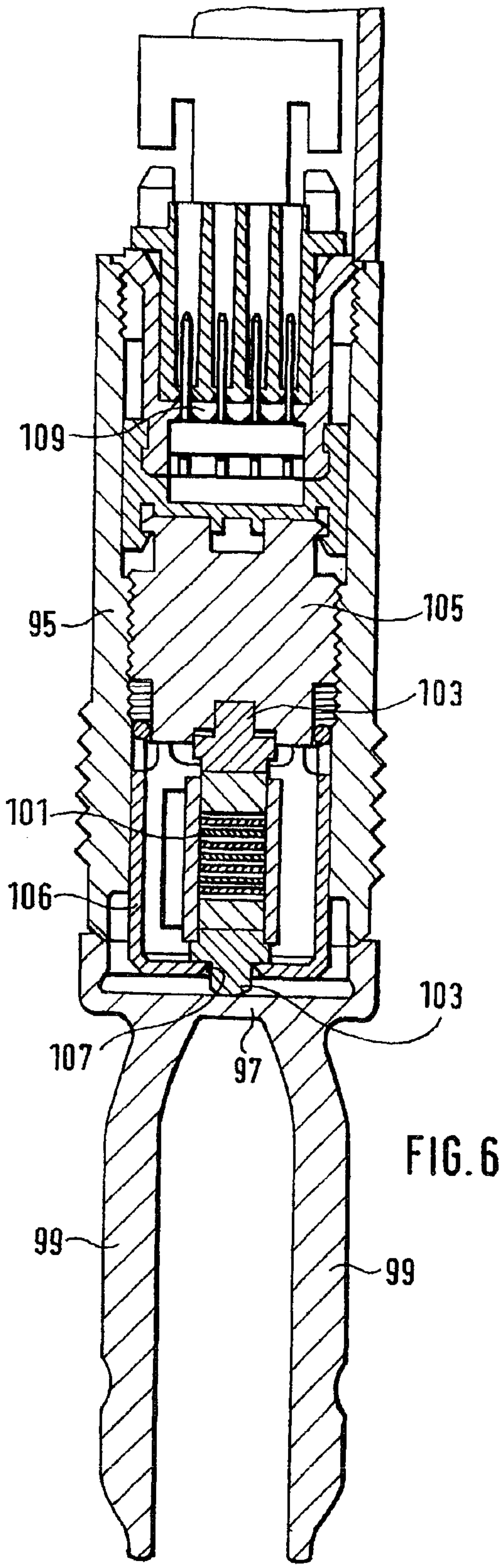
FIG. 6 shows a section through a device for ascertaining and/or monitoring a predetermined fill in a container, having an electromechanical transducer of the invention.
Figure 7:
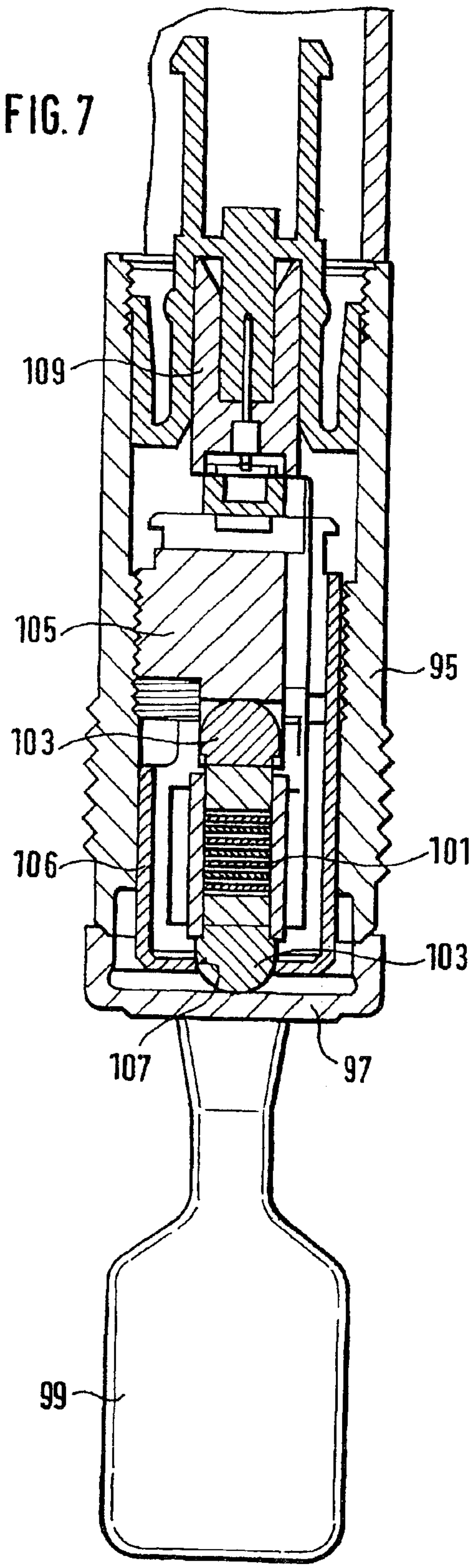
FIG. 7 shows a section through the device of FIG. 6, in which the section plane is rotated by 90° compared to the section plane of FIG. 6.

FIGS. 6 and 7 show two sectional planes, rotated by 90° from one another, through a device for ascertaining and/or monitoring a predetermined fill level in a container, which device has an electromechanical transducer 101 of the invention.

The device has an essentially cylindrical housing 95, which is closed on the end, flush at the front, by a circular-segment-shaped diaphragm 97. Two oscillator bars 99 pointing into the container are formed onto the outside of the housing 95, at the diaphragm 97. The housing 95, diaphragm 97 and oscillator bars 99 are components of a mechanical oscillation structure, which is set into oscillation by an electromechanical transducer 101 disposed in the interior of the housing 95. The diaphragm 97 executes bending oscillations, while the oscillator bars 99 are set into oscillation perpendicular to their longitudinal axis. However, oscillation structures that have only one oscillator bar, or none, are also possible. In this last case, only the oscillating diaphragm for instance comes into contact with a product located in the container.

The device should be mounted at the level of a predetermined fill level. To that end, a male thread is provided on the housing 95, by means of which the device can be screwed into a suitable opening in a container. Other types of fastening, such as by means of flanges, can also be employed. Other types of fastening, such as by means of flanges, can also be employed.

An electromechanical transducer 101 of the invention is provided, of the kind described above in conjunction with the exemplary embodiments shown in FIGS. 1–5. In operation, it serves to set the mechanical oscillation structure into oscillation and to pick up its oscillation, dependent on an instantaneous fill level, and make it accessible to further processing and/or evaluation.

The transducer 101 is enclosed between a first and a second die 103, each adjoining the stack at the end. The dies 103 preferably comprise a very hard material, such as a metal.

The transducer 101 is fastened in place along a longitudinal axis of the housing 95, between a pressure screw 105, screwed into the housing 95, and the diaphragm 97. As a result, the diaphragm 97 is prestressed.

In operation, the transmitter serves to excite the mechanical oscillation structure to mechanical oscillation. For that purpose, in operation, an electrical transmission signal is applied to the transmitter, and by means of it the transmitter and thus the transducer 101 are excited to thickness oscillations.

Accordingly, an oscillation of the oscillator bars 99 causes a bending oscillation of the diaphragm 97, which in turn causes a thickness oscillation of the transducer 101. This thickness oscillation causes a change in the voltage that is dropping across the receiver. A corresponding reception signal is available via the reception signal line LE.

The amplitude of these received signals is greater, the higher the mechanical oscillation amplitude of the mechanical oscillation structure. Utilizing this fact, the arrangement is preferably operated at its resonant frequency $f_r$. At the resonant frequency $f_r$, the mechanical oscillation amplitude is maximal.

To enable the mechanical oscillation structure to be set into oscillation at its resonant frequency $f_r$, a closed-loop control circuit can for instance be provided, which regulates a phase difference, existing between the transmitted signal and the received signal to a certain constant value, for instance by feeding a received signal back to the transmission signal via a phase displacer and an amplifier. A closed-loop control circuit of this kind is described in German Patent Disclosure DE-A 44 19 617, for instance.

The resultant resonant frequency $f_r$ and its amplitude depend on whether the mechanical oscillation structure is covered by the product in the container, or not. Correspondingly, one or both measured variables can be used to ascertain and/or monitor the predetermined fill level.

For instance, the received signal can be delivered to an evaluation unit, which determines its frequency by means of a frequency measuring circuit and delivers the outcome to a comparator. The comparator compares the measured frequency with a reference frequency $f_R$ stored in a memory. If the measured frequency is less than the resonant frequency $f_R$, the evaluation unit emits an output signal that indicates whether the mechanical oscillation structure is covered by a product. If the frequency has a value greater than the reference frequency $f_R$, then the evaluation unit emits an output signal that indicates that the mechanical oscillation structure is not covered by the product.

The output signal is for instance a voltage that assumes a corresponding value, or a voltage that has a corresponding value or on which a signal current, in the form of pulses of a suitable frequency or suitable duration, is superimposed.

The piezoelectric elements 1, 3, 5, 7, 9, 11 are placed in a tube, from the side of which the flexible printed circuit board 13 is extended to the outside. The dies 103 are slipped onto the tube at the end. The printed circuit board, in the mounted state, is wrapped around the stack and disposed in an insert 106 in the housing 95. The insert 106 is essentially cup-shaped and has a bottom in the middle of which a continuous opening 107 is provided. The shape of the opening 107 is made to conform to that of the die 103. The diaphragm 97 preferably has a depression, made to conform with the shape of the first die 103, in which the round tip of the die 103 is rotatably supported. This form of support offers the advantage that because of the round form of the tip and of the depression, rotation is easily possible without major friction losses and without torsional forces being exerted on the stack, and nevertheless, because of the large contact surface of the tip in the depression, a very good mechanical transmission of force from the stack to the diaphragm 97 is simultaneously assured.

The insert 106 has a narrow wall portion, extended in the direction away from the diaphragm, that acts as a protective backrest for the portion 52 of the flexible printed circuit board 13 that leads to the plug 53.

The pressure screw 105 is connected to the insert 106 by a snap closure. To that end, the insert 106 has two recesses, facing one another on its end remote from the membrane, and correspondingly shaped detent lugs provided on an end toward the diaphragm of the pressure screw 105 snap into these recesses. The snap closure offers the advantage that the insert 106 and the pressure screw 105 are joined solidly to one another in a very simple way.

The pressure screw 105 has a recess, open at the side, through which the portion 52 of the flexible printed circuit board 13 connected to the plug 53 is guided.

A plug connector 109 is slipped onto the plug, and by way of this connector the electromechanical transducer can be connected.

What is claimed is:

1. An electromechanical transducer, comprising:

a plurality of piezoelectric elements disposed in a stack;

a plurality of electrically connected contact electrodes each disposed between adjacent ones of said piezoelectric elements; and a flexible printed circuit board to which said plurality of electrically connected contact electrodes are connected and from which they extend, wherein said plurality of electrically connected contact electrodes comprise planar terminal lugs.

2. The electromechanical transducer as defined in claim 1, wherein said flexible printed circuit board has one portion embodied in steplike fashion comprising a plurality of steps, from each of which a respective one of said planar terminal lugs extends to the outside, and wherein the height of each of said steps is equal to the thickness of one of said plurality of piezoelectric elements adjoining said respective step.

3. The electromechanical transducer as defined in claim 1, wherein said stack comprises two partial stacks disposed one on the other, and wherein said plurality of piezoelectric elements associated with each partial stack are connected by means of respective ones of said plurality of planar terminal lugs, which are disposed around a bottom face associated with said partial stack.

4. The electromechanical transducer as defined in claim 1, wherein said flexible printed circuit board has one portion having a plurality of conductor tracks which extend one above the other, wherein each conductor track ends in a terminal lug extending perpendicular to said conductor track, and wherein the individual terminal lugs are disposed parallel to one another and serve to connect piezoelectric elements adjoining them.

5. The electromechanical transducer as defined in claim 1, wherein electronic components are disposed on said flexible printed circuit board.

6. The electromechanical transducer as defined in claim 5, wherein the electronic components include SMDs.

7. A method for producing a electromechanical transducer, having a plurality of piezoelectric elements, a plurality of electrically connected contact electrodes comprising planar terminal lugs, and a flexible printed circuit board, the method comprising the steps of:

stacking the plurality of piezoelectric elements, said stacking being compact;

equipping the flexible printed circuit board with components; and disposing the planar terminal lugs parallel to one another and one above the other by deformation of the flexible printed circuit board, as a result of which the piezoelectric elements are stacked on one another.

8. The method as defined in claim 7, wherein the components are one of: piezoelectric elements and SMDs.

9. The method as defined in claim 7, wherein the steps are done automatically.

10. A device for ascertaining and/or monitoring a predetermined fill level in a container, comprising:

a mechanical oscillation structure mounted at the height of the predetermined fill level; and an electromechanical transducer, comprising: a plurality of piezoelectric elements disposed in a stack; a plurality of electrically connected contact electrodes each disposed between adjacent ones of said piezoelectric elements, and a flexible printed circuit board to which said plurality of electrically connected contact electrodes are connected and from which they extend, wherein said electromechanical transducer in operation serves to set said mechanical oscillation structure into oscillation and pick up its oscillations that are dependent on an instantaneous fill level and make them accessible for further processing and/or evaluation.

11. The electromechanical transducer as defined in claim 10, wherein said flexible printed circuit board has one portion embodied in steplike fashion comprising a plurality of steps, from each of which a respective one of said planar terminal lugs extends to the outside, and wherein the height of each of said steps is equal to the thickness of one of said plurality of piezoelectric elements adjoining said respective step.

12. The electromechanical transducer as defined in claim 10, wherein said stack comprises two partial stacks disposed one on the other, and wherein said plurality of piezoelectric elements associated with each partial stack are connected by means of respective ones of said plurality of planar terminal lugs, which are disposed around a bottom face associated with said partial stack.

13. The electromechanical transducer as defined in claim 10, wherein said flexible printed circuit board has one portion having a plurality of conductor tracks which extend one above the other, wherein each conductor track ends in a terminal lug extending perpendicular to said conductor track, and wherein the individual terminal lugs are disposed parallel to one another and serve to connect piezoelectric elements adjoining them.

14. The electromechanical transducer as defined in claim 10, wherein electronic components are disposed on said flexible printed circuit board.

15. The electromechanical transducer as defined in claim 14, wherein the electronic components include SMDs.

* * * * *